(12) United States Patent
Sato

(10) Patent No.: US 8,270,624 B2
(45) Date of Patent: Sep. 18, 2012

(54) NOISE CANCELLING DEVICE AND METHOD, AND NOISE CANCELLING PROGRAM

(75) Inventor: Miki Sato, Minato-ku (JP)

(73) Assignee: NEC Corporation, Tokyo (JP)

( * ) Notice: Subject to any disclaimer, the term of this patent is extended or adjusted under 35 U.S.C. 154(b) by 680 days.

(21) Appl. No.: 12/303,803

(22) PCT Filed: May 31, 2007

(86) PCT No.: PCT/JP2007/061064
§ 371 (c)(1),
(2), (4) Date: Dec. 8, 2008

(87) PCT Pub. No.: WO2007/142111
PCT Pub. Date: Dec. 13, 2007

(65) Prior Publication Data
US 2010/0183165 A1 Jul. 22, 2010

(30) Foreign Application Priority Data
Jun. 8, 2006 (JP) .................. 2006-159721

(51) Int. Cl.
*G10K 11/16* (2006.01)
(52) U.S. Cl. .................. 381/71.11
(58) Field of Classification Search ............ 381/71.11, 381/94.1; 375/232
See application file for complete search history.

(56) References Cited

U.S. PATENT DOCUMENTS
5,473,702 A * 12/1995 Yoshida et al. ............. 381/94.7

FOREIGN PATENT DOCUMENTS

| JP | 05-341792 A | 12/1993 |
|---|---|---|
| JP | 06-067693 A | 3/1994 |
| JP | 06-083366 A | 3/1994 |
| JP | 06-118967 A | 4/1994 |
| JP | 07-064573 A | 3/1995 |
| JP | 07-104769 A | 4/1995 |
| JP | 07-199963 A | 8/1995 |
| JP | 08-076774 A | 3/1996 |
| JP | 09-018291 A | 1/1997 |
| JP | 10-083189 A | 3/1998 |

OTHER PUBLICATIONS

Bernard Widrow et al., "Adaptive Noise Cancelling: Principles and Applications", Proceedings of the IEEE, Dec. 1975, pp. 1692-1716, vol. 63, No. 12.
Jin-Ichi Nagumo et al, "A Learning Method for System Identification", IEEE Transactions on Automatic Control, Jun. 1967, pp. 282-287, vol. 12, No. 3.

* cited by examiner

*Primary Examiner* — Robert Pascal
*Assistant Examiner* — Khiem Nguyen
(74) *Attorney, Agent, or Firm* — Sughrue Mion, PLLC

(57) ABSTRACT

A noise cancelling device for detecting divergence of a coefficient of an adaptive filter without setting a threshold value in advance based on characteristics of a device from which noise is to be cancelled or an environment. The noise cancelling device includes: a divergence coefficient unit for obtaining a filter divergence coefficient from a filter coefficient of a section not including a filter coefficient at a basic tap position decided by the distance between a reference input unit and an audio input unit; a divergence threshold value calculation unit for obtaining a filter divergence threshold value from a filter coefficient of a section including the filter coefficient at the basic tap position; and a divergence detection unit for comparing the filter divergence coefficient to the filter divergence threshold value so as to detect the divergence condition of the adaptive filter.

34 Claims, 7 Drawing Sheets

NORMAL CONDITION

DIVERGED CONDITION

NOISE CANCELLING DEVICE AND METHOD, AND NOISE CANCELLING PROGRAM

CROSS REFERENCE TO RELATED APPLICATIONS

This application is a National Stage of International Application No. PCT/JP2007/061064 filed May 31, 20007, claiming priority based on Japanese Patent Application No. 2006-159721 filed Jun. 8, 2006, the contents of all of which are incorporated herein by reference in their entirety.

BACKGROUND OF THE INVENTION

1. Technical Field

The present invention relates to noise cancelling devices and methods, and noise cancelling programs, and in particular, to a noise cancelling device and method, and a noise cancelling program for cancelling background noise signal mixed in an audio signal input from a microphone, a handset, and the like using an adaptive filter.

2. Background Art

The background noise signal mixed in the audio signal input from the microphone, the handset, or the like is a large problem in a narrow band voice coding device, a voice recognition device, or the like having large information compressibility. For the noise cancelling method aiming to cancel the acoustically superimposed noise component, a two-input noise cancelling method using an adaptive filter is described in "Adaptive Noise Cancelling: Principles and Applications" (B. Widrowet. Al., PROCEEDINGS OF IEEE, VOL. 63, NO. 12, 1975, pp. 1692-1716) (hereinafter referred to as non-patent document 1).

The two-input noise cancelling method is a method of generating a pseudo-noise signal corresponding to a noise signal component mixed at an audio input terminal, and subtracting the pseudo-noise signal from a received audio signal (coexisting signal of audio signal and noise signal) input to the audio input terminal to cancel the noise signal using an adaptive filter for approximating an impulse response of a path (noise path) through which the noise signal input to a reference input terminal passes to reach the audio input terminal.

A filter coefficient of the adaptive filter in the two-input noise cancelling method is updated by taking a correlation of an error signal obtained by subtracting the pseudo-noise signal from the received audio signal, and a reference signal input to the reference input terminal. For a coefficient updating algorithm of the adaptive filter, "LMS algorithm (Least-Mean-Square ALGORITHM)" and "LIM (Learning Identification Method)" described in "A learning method for system identification" (J. I. Nagumo, IEEE Transactions on Automatic Control, VOL. 12, NO. 3, 1967, pp. 282-287) (hereinafter referred to as non-patent document 2) are known.

However, in the noise cancelling method using the adaptive filter described above, the update of the coefficient of the adaptive filter may not follow the change of the reference signal and the filter coefficient of the adaptive filter may diverge depending on conditions such as the amplitude of the reference signal is too large with respect to an input range, or, the change in phase and amplitude of the reference signal are rapid, or, the noise component such as electrical noise on a circuit other than the audio signal is mixed in the reference signal.

When the filter coefficient of the adaptive filter diverges, the pseudo-noise signal is mistakenly generated, and the noise cancelling of the output signal may not be properly carried out. Furthermore, it takes time for the filter coefficient of the adaptive filter that is once diverged to again converge to a correct value. In order to avoid this, the divergence needs to be avoided by stopping the update of the coefficient when detecting the divergence of the filter coefficient of the adaptive filter.

The noise cancelling method for avoiding the divergence of coefficient of the adaptive filter includes a method of detecting divergence when a level of the reference signal exceeds a pre-set threshold value described in Japanese Laid-Open Patent Publication No. 5-341792 "Noise reduction device" (hereinafter referred to as patent document 1); a method of detecting divergence when a maximum value of an absolute value of the coefficient of the adaptive filter exceeds a pre-set threshold value described in Japanese Laid-Open Patent Publication No. 7-64573 "Active noise reduction device" (hereinafter referred to as patent document 2); and a method of detecting divergence when a filter power of the adaptive filter exceeds a pre-set threshold value described in Japanese Laid-Open Patent Publication No. 7-199963 "Active cancelling device of in-vehicle noise" (hereinafter referred to as patent document 3).

Non-patent document 1: Adaptive Noise Cancelling: Principles and Applications"; B. Widrowet. Al., PROCEEDINGS OF IEEE, VOL. 63, NO. 12, 1975, pp. 1692-1716

Non-patent document 2: A learning method for system identification; J. I. Nagumo, IEEE Transactions on Automatic Control, VOL. 12, NO. 3, 1967, pp. 282-287;

Patent document 1: Japanese Laid-Open Patent Publication No. 5-341792 (P. 6, FIG. 1)

Patent document 2: Japanese Laid-Open Patent Publication No. 7-64573 (P. 6, FIG. 1)

Patent document 3: Japanese Laid-Open Patent Publication No. 7-199963 (P. 5, FIG. 1)

DISCLOSURE OF INVENTION

Problems to be Solved by the Invention

However, the methods disclosed in patent documents 1, 2, and 3 need to set the threshold value in advance to determine that the filter coefficient of the adaptive filter diverged, and have a problem in that the threshold values need to be changed based on characteristics of a device from which a noise is to be cancelled and an environment.

It is an object of the present invention to resolve such problem, and to provide a noise cancelling device and method, and a noise cancelling program for detecting divergence of a filter coefficient of an adaptive filter, and avoiding mistaken operation of noise cancelling due to divergence of the filter coefficient without setting the threshold value in advance based on characteristics of a device from which a noise is to be cancelled or an environment.

Means for Solving the Problem

In order to achieve the above aim, a noise cancelling device according to the present invention relates to a noise cancelling device for generating a noise suppressed signal by subtracting a pseudo-noise signal generated by an adaptive filter based on a reference side sound receiving signal generated by a reference input unit from an audio side sound receiving signal generated by an audio input unit, and the noise cancelling device includes a coefficient classifying unit for classifying filter coefficients of the adaptive filter into a plurality of groups using a basic tap position corresponding to a distance between the reference input unit and the audio input unit; a divergence detection unit for analyzing a relationship among the plurality of groups of the filter coefficients and analyzing a divergence condition of the adaptive filter; and a coefficient initialization unit for initializing the filter coefficient if the coefficient of the adaptive filter is diverged.

A noise cancelling method according to the present invention relates to a noise cancelling method for generating a noise suppressed signal by subtracting a pseudo-noise signal generated by an adaptive filter based on a reference side sound receiving signal generated by a reference input unit from an audio side sound receiving signal generated by an audio input unit, and the noise cancelling method includes the steps of coefficient classifying step of classifying filter coefficients of the adaptive filter into a plurality of groups using a basic tap position corresponding to a distance between the reference input unit and the audio input unit; divergence detecting step of analyzing a relationship among the plurality of groups of the filter coefficients and analyzing a divergence condition of the adaptive filter; and initializing step of initializing the filter coefficient if the coefficient of the adaptive filter is diverged.

A non-transitory computer readable recording medium storing a noise cancelling program according to the present invention relates to a noise cancelling program for causing a computer configuring a noise cancelling device, which generates a noise suppressed signal by subtracting a pseudo-noise signal generated by an adaptive filter based on a reference side sound receiving signal generated by a reference input unit from an audio side sound receiving signal generated by an audio input unit, to execute functions of classifying filter coefficients of the adaptive filter into a plurality of groups using a basic tap position corresponding to a distance between the reference input unit and the audio input unit; analyzing a relationship among the plurality of groups of the filter coefficients and analyzing a divergence condition of the adaptive filter; and initializing the filter coefficient if the coefficient of the adaptive filter is diverged.

The filter coefficient of the adaptive filter represents an impulse response of a path (noise path) from a reference input terminal to an audio input terminal, and has a peak value near the shortest path from the reference input terminal to the audio input terminal. The peak value generally exists at a basic tap position corresponding to the vicinity of df/c[sec] where a distance from the reference input terminal to the audio input terminal is d[m], a sound speed is c[m/sec], and a sampling rate of acoustic-electric conversion is f[Hz]. Since the power of sound attenuates as the distance becomes longer, the filter coefficient takes a smaller value as the tap position becomes further behind the basic tap position.

On the contrary, if the filter coefficient has a diverged value irrespective of the tap position, the adaptive filter is in an abnormal condition.

In the present invention, detection of divergence condition is performed by comparing a first index obtained from the filter coefficient of a section not including the filter coefficient at the basic tap position and a second index obtained from the filter coefficient of a section including the filter coefficient at the basic tap position, and initialization of the filter coefficient of the adaptive filter is performed if the divergence condition is detected.

In other words, judgment is made as not diverged if the first index is smaller than the second index, and the filter coefficient of the adaptive filter is updated such that the error audio signal becomes a minimum based on the filter coefficient updating step; whereas judgment is made as diverged if the first index is greater than the second index, and a condition is initialized such that the filter coefficient of the adaptive filter is not diverged based on the filter coefficient initializing step.

Advantageous Effect of the Invention

According to the present invention described above, the detection of divergence of the filter coefficient of the adaptive filter is performed using a value calculated from the filter coefficient of the adaptive filter, and thus noise cancelling of performing the detection of divergence of the filter coefficient of the adaptive filter and avoiding mistaken operation of noise cancelling due to divergence of the filter coefficient can be realized without setting a threshold value in advance according to characteristics of a device from which a noise is to be cancelled or an environment.

BEST MODE FOR CARRYING OUT THE INVENTION

Exemplary embodiments of the invention will now be specifically described with reference to the drawings.

First Exemplary Embodiment

As shown in FIG. 1, a noise cancelling device according to a first exemplary embodiment of the invention includes an audio input unit 1, a reference input unit 2, an adaptive filter 3, a subtractor 4, an output terminal 5, a first power calculation circuit 6, a second power calculation circuit 7, a comparison circuit 8, and a coefficient initialization circuit 9.

The adaptive filter 3 configures a coefficient classifying unit for classifying filter coefficients of the adaptive filter into a plurality of groups using a basic tap position corresponding to a distance between the reference input unit 2 and the audio input unit 1. The power calculation circuit 6 configures a divergence coefficient calculation unit for obtaining a filter divergence coefficient from a filter coefficient of a section not including a filter coefficient at a basic tap position decided by the distance between the reference input unit 2 and the audio input unit 1. The power calculation circuit 7 configures a divergence threshold value calculation unit for obtaining a filter divergence threshold value from a filter coefficient of a section including the filter coefficient at the basic tap position T. The comparison circuit 8 configures a divergence detection unit for comparing the filter divergence coefficient to the filter divergence threshold value so as to detect the divergence condition of the adaptive filter. The coefficient initialization circuit configures a coefficient initialization unit for initializing the filter coefficient of the adaptive filter based on the divergence detected signal from the divergence detection unit.

The audio input unit 1 is configured by an acoustic-electric converter such as a microphone arranged near the speaker, and has a function of generating an acoustic-electric converted signal $X_p(k)$. The audio input unit 1 sometimes pick up background noise in addition to the voice of the speaker as it is arranged near the speaker, and thus the signal $X_p(k)$ generated by the audio input unit 1 has a background noise signal n(k) mixed in the target audio signal S(k), as shown in equation (1).

$$X_p(k)=S(k)+n(k) \qquad (1)$$

The reference input unit 2 is configured by an acoustic-electric converter such as a microphone arranged at a position distant from the speaker than the audio input unit 1, and has a function of generating the acoustic-electric converted signal $X_r(k)$. Since the reference input unit 2 is arranged at a position distant from the speaker than the audio input unit 1, the signal $X_r(k)$ generated by the reference input unit 2 corresponds to the background noise signal $N(k)$ input to the audio input unit 1, as shown in equation (2), if the reference input unit 2 is at a position sufficiently distant from the speaker.

$$X_r(k)=N(k) \tag{2}$$

The subtractor 4 has a function of subtracting a pseudo-noise signal $R(k)$ generated by the adaptive filter 3 from the signal $X_p(k)$ generated by the audio input unit 1 to generate a difference signal $e(k)$ shown in equation (3), outputting the difference signal $e(k)$ to the output terminal as noise cancelled signal, and providing the difference signal $e(k)$ to the adaptive filter 3 as an error signal for updating the coefficient of the adaptive filter 3.

$$e(k)=S(k)+n(k)-R(k) \tag{3}$$

The adaptive filter 3 has a function of performing a filter product-sum operation, with the signal $X_r(k)$ generated by the reference input unit 2 as a filter input, and generating the pseudo-noise signal $R(k)$ serving as a first pseudo-signal as an operation result of the filter.

The filter coefficient of the adaptive filter 3 represents an impulse response of a path (noise path) from the reference input unit 2 to the audio input unit 1, and has a peak value near the shortest path from the reference input unit 2 to the audio input unit 1. The peak value of the filter coefficient generally exists at a tap position corresponding to the vicinity of $d/c$ [sec] where the distance from the reference input unit 2 to the audio input unit 1 is $d$[m] and the sound speed is $c$[m/sec]. This tap position is hereinafter referred to as basic tap position. Since the power of sound attenuates as the distance becomes longer, the filter coefficient takes a smaller value as the tap position becomes further behind the basic tap position. On the contrary, if the filter coefficient has a diverged value irrespective of the tap position, the adaptive filter 3 is in an abnormal condition.

The basic tap position T of the adaptive filter 3 is expressed by equation (4) using the distance $d$[m] from the reference input unit 2 to the audio input unit 1, the sound speed $c$[m/sec], and the sampling rate $f$[Hz] of acoustic-electric conversion.

$$T=df/c \tag{4}$$

The basic tap position T of the adaptive filter 3 may be appropriately corrected in view of the position of the noise source, and the like.

The adaptive filter 3 has a function of updating the filter coefficient using the coefficient updating algorithm based on the difference signal $e(k)$ output from the subtractor 4. The coefficient updating method will be discussed below assuming the "LMS algorithm" of non-patent document 1 for the coefficient updating algorithm of the adaptive filter 3. Suppose the $j^{th}$ coefficient of the adaptive filter 3 at time k is $w_j(k)$, the pseudo-noise signal $R(k)$ generated by the adaptive filter 3 is expressed by equation (5).

$$R(k)=\Sigma w_j(k) \cdot X_r(k-j) \tag{5}$$

Here, $\Sigma$ represents the total sum from $j=0$ to $j=N-1$, where N is the number of taps of the adaptive filter 3. In the first exemplary embodiment, N is an integer satisfying equation (6).

$$N>2T \tag{6}$$

The coefficient update is calculated by equation (7).

$$w_j(k+1)=w_j(k)+\alpha e(k) \cdot X_r(k-j) \tag{7}$$

Here, $\alpha$ is a constant referred to as a step size, and is a parameter for determining the convergence time of the coefficient and the residual error amount after convergence.

The basic configuration of the present invention has features in detecting the divergence condition of the adaptive filter 3 by comparing the filter divergence coefficient obtained from the filter coefficient of a section not including the filter coefficient at the basic tap position T and the filter divergence threshold value obtained from the filter coefficient of a section including the filter coefficient at the basic tap position T, and initializing the filter coefficient of the adaptive filter 3 when the divergence condition is detected.

In the first exemplary embodiment of the invention, the power calculation circuit 6, the power calculation circuit 7, and the comparison circuit 8 are arranged to detect the divergence condition of the adaptive filter 3 by comparing the filter divergence coefficient obtained from the filter coefficient of the section not including the filter coefficient at the basic tap position T and the filter divergence threshold value obtained from the filter coefficient of a section including the filter coefficient at the basic tap position T.

The power calculation circuit 6 has a function of generating a filter power $P_1(k)$ of the filter coefficient in a constant range L1 not including the filter coefficient at the basic tap position T of the adaptive filter 3. The filter power $P_1(k)$ corresponds to the filter divergence coefficient obtained from the filter coefficient of the section not including the filter coefficient at the basic tap position T.

In the exemplary embodiment, the range L1 lies from $A^{th}$ filter coefficient to the $N-1^{th}$ filter coefficient of the adaptive filter 3.

Here, the filter power $P_1(k)$ is expressed as equation (8) using the coefficient $w_j(k)$ of the adaptive filter 3.

$$P_1(k)=\Sigma_{j=A}^{j=N-1} W_j^2(k) \tag{8}$$

Here, $$\Sigma_{j=A}^{j=N-1}$$

represents the total sum from $j=A$ to $j=N-1$.

When N is an even number, A is an integer that becomes $A=N/2$. When N is an odd number, A is an integer that becomes $A=(N+1)/2(10-A)$ or $A=(N-1)/2(10-B)$.

The power calculation circuit 7 has a function of generating a filter power $P_2(k)$ of the filter coefficient in a constant range L2 including the filter coefficient at the basic tap position T of the adaptive filter 3. The filter power $P_2(k)$ corresponds to the filter divergence threshold value obtained from the filter coefficient of the section including the filter coefficient at the basic tap position T.

In the first exemplary embodiment, the range L2 lies from the $0^{th}$ filter coefficient to the $B-1^{th}$ filter coefficient of the adaptive filter 3.

Here, the filter power $P_2(k)$ is expressed as equation (9) using the coefficient $w_j(k)$ of the adaptive filter 3.

$$P_2(k)=\Sigma_{j=0}^{j=B-1} W_j^2(k) \tag{9}$$

Here, $$\Sigma_{j=0}^{j=B-1}$$

represents the total sum from $j=0$ to $j=B-1$.

B is an integer that becomes $B=N-A$.

As shown in FIG. 2(*a*), the filter coefficient at the basic tap position T of the adaptive filter 3 takes a value larger than other filter coefficients in a non-diverged condition (hereinafter referred to as normal condition), where in the exemplary embodiment, the filter power $P_2(k)$ including the filter coefficient at the basic tap position T takes a value larger than the filter power $P_1(k)$ since the range L1 and the range L2 have the same tap length.

As shown in FIG. 2(b), the filter coefficient of the adaptive filter 3 takes a diverged value irrespective of the basic tap position in a diverged condition (hereinafter referred to as diverged condition), and thus judgment is made as the diverged condition if the filter power $P_1(k)$ takes a value larger than the filter power $P_2(k)$.

The section 1 in FIG. 2 shows the range L1, and the section 2 shows the range L2.

The comparison circuit 8 is arranged to detect whether or not the filter coefficient of the adaptive filter 3 is diverged. The comparison circuit 8 has a function of comparing the magnitude of the filter power $P_1(k)$ and the filter power $P_2(k)$, and generating a divergence detected signal if the filter power $P_1(k)$ becomes greater than the filter power $P_2(k)$.

In the exemplary embodiment described above, the comparison circuit 8 has a configuration of generating the divergence detected signal based on the comparison result of the magnitude of the filter power $P_1(k)$ and the filter power $P_2(k)$, but is not limited thereto. The comparison circuit 8 may have a configuration of obtaining a ratio of the filter power $P_1(k)$ and the filter power $P_2(k)$ in the normal condition by analyzing the characteristics of a device or an environment in the normal condition, comparing the magnitude of a value obtained by multiplying a constant, which takes such ratio into consideration, by the filter power $P_1(k)$ and the filter power $P_2(k)$, and generating the divergence detected signal.

The coefficient initialization circuit 9 has a function of replacing all the filter coefficients of the adaptive filter 3 to zero to resolve the diverged condition in response to the divergence detected signal from the comparison circuit 8.

The coefficient initialization circuit 9 has a configuration of replacing all the filter coefficients of the adaptive filter 3 to zero, but is not limited thereto. The coefficient initialization circuit 9 may have a configuration of storing the value of the filter coefficient before divergence of the adaptive filter 3, and replacing all the coefficients of the adaptive filter 3 to the past filter coefficients.

A method of cancelling the background noise signal n(k) mixed in the target audio signal S(k) using the noise cancelling device shown in FIG. 1 will now be described based on FIG. 3.

The noise cancelling method according to the exemplary embodiment of the invention has features in executing, as basic configuration, a coefficient calculating step of classifying the filter coefficients of the adaptive filter 3 into a plurality of groups using the basic tap position obtained from the distance of the reference input unit 2 and the audio input unit; a divergence detecting step of analyzing the relationship between the plurality of groups of the filter coefficient, and analyzing the divergence condition of the adaptive filter; and an initializing step of initializing the filter coefficient if the coefficient of the adaptive filter is diverged. The basic tap position is obtained using the distance between the reference input unit and the audio input unit, the sound speed, and the sampling frequency.

The filter coefficients are classified into a plurality of groups of a group including the filter coefficient at the basic tap position, and a group including other filter coefficients. Or, the filter coefficient may be classified into a plurality of groups of a group including the filter coefficient at the vicinity of the basic tap position, and a group including other filter coefficients. In this case, the tap lengths of the groups are set the same. As described above, the plurality of groups may be set to a group of the first half and a group of a second half of a total tap length of the adaptive filter, where the filter coefficient at the basic tap position may be included in either group of the first half or the second half.

An example of analyzing the relationship among the plurality of groups of the filter coefficients based on the filter divergence coefficient obtained from the group including the filter coefficient at the basic tap position, and the filter divergence threshold value obtained from the group including other filter coefficients, and analyzing as the adaptive filter being in the diverged condition if the filter divergence coefficient is larger than constant multiples of the filter divergence threshold value will be specifically described.

In step S1 of FIG. 3, the voice of the speaker is converted to an electric signal using the audio input unit 1. In this case, if background noise exists in the ambient environment of the speaker, the signal (audio side sound receiving signal) generated by the audio input unit 1 has a background noise signal n(k) mixed in the target audio signal S(k). This background noise signal n(k) needs to be cancelled.

In parallel to step S1 of FIG. 3, the signal N(k) serving as the reference side sound receiving signal is generated at a position distant from the speaker than the audio input unit 1 using the reference input unit 2 in step S2.

In step S3 of FIG. 3, the adaptive filter 3 generates the pseudo-noise signal by filtering according to the filter coefficient with the reference side sound receiving signal generated by the reference input unit 2 as the input. That is, the adaptive filter 3 performs a filter product-sum operation, with the signal $X_r(k)$ generated by the reference input unit 2 as a filter input, and generates the pseudo-noise signal R(k) serving as a first pseudo-signal as an operation result of the filter.

In step S4 of FIG. 3, the subtractor 4 subtracts the pseudo-noise signal from the audio side sound receiving signal, with the audio side sound receiving signal generated by the audio input unit 1 and the pseudo-noise signal generated by the adaptive filter 3 as inputs, to generate an error audio signal (difference signal). That is, the subtractor 4 subtracts a pseudo-noise signal R(k) generated by the adaptive filter 3 from the signal $X_p(k)$ generated by the audio input unit 1 to generate the difference signal e(k) shown in equation (3), and outputs the difference signal e(k) to the output terminal 5 as noise cancelled signal, and at the same time, provides the difference signal e(k) to the adaptive filter 3 as an error signal for updating the coefficient of the adaptive filter 3.

In step S5 of FIG. 3, the adaptive filter 3 sequentially updates the filter coefficient such that the error audio signal becomes a minimum. That is, the adaptive filter 3 updates the filter coefficient using the coefficient updating algorithm based on the difference signal e(k) output from the subtractor 4.

In step S6 of FIG. 3, the power calculation circuit 6 generates the filter power $P_1(k)$ of the filter coefficient in the constant range L1 not including the filter coefficient at the basic tap position T of the adaptive filter 3. The filter power $P_1(k)$ is the filter divergence coefficient obtained from the filter coefficient of the section not including the filter coefficient at the basic tap position T.

In step S7 of FIG. 3, the power calculation circuit 7 generates the filter power $P_2(k)$ of the filter coefficient in the constant range L2 including the filter coefficient at the basic tap position T of the adaptive filter 3. The filter power $P_2(k)$ is the filter divergence threshold value obtained from the filter coefficient of the section including the filter coefficient at the basic tap position T.

In step S8 of FIG. 3, the comparison circuit 8 compares the magnitude of the filter power $P_1(k)$ and the filter power $P_2(k)$. The comparison circuit 8 generates the divergence detected signal when the filter divergence coefficient is greater than the filter divergence threshold value, that is, when the filter power $P_1(k)$ becomes greater than the filter power $P_2(k)$ (YES in step S8).

In step S9 of FIG. 3, the coefficient initialization circuit 9 outputs to the adaptive filter 3 a command to replace all the filter coefficients of the adaptive filter 3 to zero to resolve the diverged condition upon reception of the divergence detected signal from the comparison circuit 8. The adaptive filter 3 resolves the diverged condition of the filter coefficient based on the command from the coefficient initialization circuit 9, and continues the operation of again sequentially updating the filter coefficient (step S5).

In step S8 of FIG. 3, the comparison circuit does not generate the divergence detected signal if the filter divergence coefficient is smaller than the filter divergence threshold value (step S8; NO), that is, if the filter power $P_1(k)$ is smaller than the filter power $P_2(k)$ as a result of comparing the magnitude of the filter power $P_1(k)$ and the filter power $P_2(k)$. Thus, the adaptive filter 3 continues to perform the operation of sequentially updating the filter coefficient such that the error audio signal becomes a minimum (step S5).

According to the first exemplary embodiment of the invention described above, when the filter coefficient of the adaptive filter 3 is diverged, detection of divergence of the filter coefficient is performed, and initialization of the filter coefficient can be carried out, whereby divergence of the filter coefficient can be avoided.

As shown in FIG. 2, in the exemplary embodiment, the range L1 includes the filter coefficient of the second half of the adaptive filter 3, and the range L2 includes the filter coefficient of the first half of the adaptive filter 3, where the basic tap position T is included in the first half, but the basic tap position may be included in the second half. The basic tap position T of the adaptive filter 3 may be extended to have a constant width.

The coefficient updating algorithm of the adaptive filter 3 is not limited to the LMS algorithm, and the modified method thereof, the learning identification method, and other methods may be used.

Second Exemplary Embodiment

Other exemplary embodiments of the invention will now be specifically described with reference to the drawings.

In the second exemplary embodiment of the invention, the divergence condition of the adaptive filter 3 is detected by comparing the filter divergence coefficient obtained from the filter coefficient of the section not including the filter coefficient at the basic tap position T and the filter divergence threshold value obtained from the filter coefficient of the section including the filter coefficient at the basic tap position T, and thus a maximum value detection circuit 10 and a maximum value detection circuit 11 are used in place of the power calculation circuit 6 and the power calculation circuit 7 of the first exemplary embodiment. Other configurations are similar to that of the first exemplary embodiment, and same reference numerals are denoted for the same components. The operation of the same components is similar to the first exemplary embodiment shown in FIG. 1, and thus, described here are the maximum value detection circuit 10 and the maximum value detection circuit 11.

The maximum value detection circuit 10 has a function of generating a maximum value $Q_1(k)$ of an absolute value of the filter coefficient of the constant range L1 not including the filter coefficient at the basic tap position T of the adaptive filter 3. In the exemplary embodiment, the range L1 lies from the $A^{th}$ filter coefficient to the $N-1^{th}$ filter coefficient of the adaptive filter 3.

Here, $A=N/2(14)$ when N is an even number, and $A=(N+1)/2(15-A)$ or $A=(N-1)/2(15-B)$ when N is an odd number.

The maximum value detection circuit 11 has a function of generating a maximum value $Q_2(k)$ of an absolute value of the filter coefficient of the constant range L2 including the filter coefficient at the basic tap position T of the adaptive filter 3. In the exemplary embodiment, the range L2 lies from the $0^{th}$ filter coefficient to the $B-1^{th}$ filter coefficient of the adaptive filter 3.

Here, B is an integer that is $B=N-A$.

In the normal condition, the filter coefficient at the basic tap position T takes a value larger than other filter coefficients, and thus the maximum value $Q_2(k)$ of the range including the filter coefficient at the basic tap position T takes a value greater than the maximum value $Q_1(k)$.

The filter coefficient takes a diverged value irrespective of the basic tap position in the diverged condition, and thus judgment is made as the diverged condition if the maximum value $Q_1(k)$ takes a value greater than the maximum value $Q_2(k)$.

FIG. 5 is a view showing one example of a filter coefficient of the adaptive filter, where FIG. 5(a) shows one example of the normal condition, and FIG. 5(b) shows one example of a diverged condition. The section 1 in FIG. 5 shows the range L1, and the section 2 shows the range L2.

The comparison circuit 8 compares the magnitude of the maximum value $Q_1(k)$ and the maximum value $Q_2(k)$, and generates a divergence detected signal if the maximum value $Q_1(k)$ becomes greater than the maximum value $Q_2(k)$. The comparison circuit 8 may have a configuration of obtaining a ratio of the maximum value $Q_1(k)$ and the maximum value $Q_2(k)$ in the normal condition by analyzing the characteristics of a device or an environment in the normal condition, comparing the magnitude of a value obtained by multiplying a constant, which takes such ratio into consideration, to the maximum value $Q_1(k)$, and the maximum value $Q_2(k)$.

In the noise cancelling method of the second exemplary embodiment, processes are executed in the processing steps similar to the noise cancelling method of the first exemplary embodiment.

According to the second exemplary embodiment of the invention described above, when the filter coefficient of the adaptive filter 3 is diverged, detection of divergence of the filter coefficient is performed, and initialization of the filter coefficient can be carried out, whereby divergence of the filter coefficient can be avoided.

Assuming that the number of taps N of the adaptive filter 3 is expressed as N>T, a configuration in which the tap lengths of the range L1 and the range L2 are differed if the maximum value $Q_1(k)$ is not greater than the maximum value $Q_2(k)$ in the normal condition may be adopted. As shown in FIG. 5, the range L1 includes the filter coefficient of the second half of the adaptive filter 3, and the range L2 includes the filter coefficient of the first half of the adaptive filter 3, where the basic tap position T is included in the first half, but the basic tap position may be included in the second half. The basic tap position T of the adaptive filter 3 may be extended to have a constant width. The coefficient updating algorithm of the adaptive filter 3 is not limited to the LMS algorithm, and the modified method thereof, the learning identification method, and other methods may be used.

In the first and the second exemplary embodiments, a case of building the present invention as the noise cancelling device and the noise cancelling method has been described, but is not limited thereto, and the present invention may be built as a non-transitory computer readable recording medium storing a noise cancelling program for causing a computer to execute the functions of the noise cancelling device shown in FIG. 1 and FIG. 4 according to the flowchart shown in FIG. 3.

The noise cancelling program according to the exemplary embodiment of the invention is built to have a configuration of causing a computer, which configures the noise cancelling device shown in FIG. 1 and FIG. 4 for subtracting the pseudo-noise signal generated by the adaptive filter based on the reference side sound receiving signal generated by the reference input unit from the audio side sound receiving signal generated by the audio input unit to generate a noise suppressed signal, to execute functions of, according to the flowchart shown in FIG. 3, obtaining a filter divergence coefficient from a filter coefficient of a section not including the filter coefficient at the basic tap position decided by the distance between the reference input unit and the audio input unit;

obtaining a filter divergence threshold value from a filter coefficient of the section including the filter coefficient at the basic tap position;

detecting a divergence condition of the adaptive filter by comparing the filter divergence coefficient and the filter divergence threshold value; and initializing the filter coefficient of the adaptive filter based on the divergence detected signal from the divergence detection unit.

A configuration of causing the computer to execute the function of obtaining the filter divergence coefficient based on a power value of the filter coefficient, and obtaining the filter divergence threshold value based on a power value of the filter coefficient may be adopted. A configuration of causing the computer to execute the function of obtaining the filter divergence coefficient based on the maximum value of the filter coefficient, and obtaining the filter divergence threshold value based on the maximum value of the filter coefficient may be adopted.

Example 1

As example 1, an example of applying the noise cancelling device according to the first exemplary embodiment of the invention shown in FIG. 1 to a robot whose operation is determined by the audio signal will be described in detail with reference to the drawings.

As shown in FIG. 6, a robot according to example 1 of the present invention includes a microphone 101, a microphone 102, an adaptive filter 103, a subtractor 104, a first power calculation circuit 106, a second power calculation circuit 107, a comparison circuit 108, a coefficient initialization circuit 109, and a voice recognition circuit 105.

The microphone 101 shown in FIG. 6 corresponds to the audio input unit 1 shown in FIG. 1, and the microphone 102 corresponds to the reference input unit 2 of FIG. 1. The adaptive filter 103 shown in FIG. 6 corresponds to the adaptive filter 3 of FIG. 1, the subtractor 104 corresponds to the subtractor 4 of FIG. 1, and the power calculation circuit 106 and the power calculation circuit 107 correspond to the power calculation circuits 6 and 7 of FIG. 1. The comparison circuit 108 shown in FIG. 6 corresponds to the comparison circuit 8 of FIG. 1, and the coefficient initialization circuit 109 corresponds to the coefficient initialization circuit 9 of FIG. 1.

The microphone 1 is installed on a front surface of the robot, and mainly outputs a signal $X_p(k)$ which is acoustic-electric converted from an acoustic signal coming from the front side of the robot. The microphone 2 is installed on a back surface of the robot, and mainly outputs a signal $X_r(k)$ which is acoustic-electric converted from an acoustic signal coming from the back side of the robot.

The front aide of the robot refers to the direction the user normally exists when using the robot seen from the robot, the back side of the robot refers to the direction opposite to the direction indicated by the front side of the robot, the front surface of the robot refers to the portion facing the front side of the robot in the robot, and the back surface of the of the robot refers to the portion facing the back side of the robot in the robot.

According to such arrangement of the microphones, the microphone 1 can acquire the acoustic signal coming from the direction in which the possibility the user generates the target signal is the highest, and the microphone 21 can acquire the acoustic signal coming from the direction in which the possibility the user generates the target signal is the lowest.

The adaptive filter 103 performs a filter product-sum operation, with the signal $X_r(k)$ output by the microphone 102 as a filter input, and outputs a pseudo-noise signal R(k) serving as a first pseudo-signal as an operation result of the filter.

The subtractor 104 subtracts the pseudo-noise signal R(k) output by the adaptive filter 103 from the signal $X_p(k)$ output by the microphone 101 to generate a difference signal e(k), and provides the difference signal e(k) to the voice recognition circuit 105 and the adaptive filter 103.

The adaptive filter 102 updates the filter coefficient with the difference signal e(k) as the input. The number of taps of the adaptive filter is 2n. Here, n is an integer.

The voice recognition circuit 105 outputs the voice recognition result with the difference signal e(k) as the input, and determines the operation of the robot 100.

The power calculation circuit 106 outputs the filter power $P_1(k)$ of the n+1$^{th}$ to the 2n$^{th}$ filter coefficients of the adaptive filter 103.

The power calculation circuit 107 outputs the filter power $P_2(k)$ of the 1$^{st}$ to the n$^{th}$ filter coefficients of the adaptive filter 103.

The comparison circuit 108 compares the magnitude of the filter power $P_1(k)$ and the filter power $P_2(k)$, and outputs the divergence detected signal if the filter power $P_1(k)$ becomes greater than the filter power $P_2(k)$.

The coefficient initialization circuit 109 replaces all the coefficients of the adaptive filter 3 to zero in response to the divergence detected signal.

Therefore, in the robot of example 1 of the present invention, when the target signal is issued from the front side of the robot and the signals other than the target are issued from the back side of the robot, the signal in which the influence of signals other than the target mixed in the output signal of the microphone 1 is alleviated is provided to the voice recognition circuit 105, whereby the recognition rate enhances and an accurate operation becomes possible.

For example, if the filter coefficient of the adaptive filter 103 is diverged under conditions such that a noise generated by a person touching the microphone 102 is mixed or noise component including electrical noise on the circuit other than the sound signal is mixed, detection of the divergence of the filter coefficient is performed, and initialization of the filter coefficient is carried out, whereby divergence of the filter coefficient can be avoided.

Example 2

As example 2, an example where the noise cancelling device according to the second exemplary embodiment of the invention shown in FIG. 4 is applied to a robot whose operation is determined by the audio signal will be described in detail with reference to the drawings.

In FIG. 7, the robot of example 2 of the present invention has a configuration in which the power calculation circuit 106 and the power calculation circuit 107 of the robot of example 1 shown in FIG. 6 are changed to a maximum detection circuit 110 and a maximum value detection circuit 111, where other configurations are the same as FIG. 6 and the same reference numerals are denoted for the same components. The operation of the same components is the same as the robot of example 1 shown in FIG. 6, and thus described here are the maximum value detection circuit 110 and the maximum value detection circuit 111.

The maximum value detection circuit 110 outputs the maximum value $Q_1(k)$ of the $n+1^{th}$ to the $2n^{th}$ filter coefficients of the adaptive filter.

The maximum value detection circuit 111 outputs the maximum value $Q_2(k)$ of the $1^{st}$ to the $n^{th}$ filter coefficients of the adaptive filter 3.

The comparison circuit 108 compares the magnitude of the maximum value $Q_1(k)$ and the maximum value $Q_2(k)$, and outputs the divergence detected signal if the maximum value $Q_1(k)$ becomes greater than the maximum value $Q_2(k)$.

Therefore, in the robot of example 2 of the present invention, when the target signal is issued from the front side of the robot and the signals other than the target are issued from the back side of the robot, the signal in which the influence of signals other than the target mixed in the output signal of the microphone 1 is alleviated is provided to the voice recognition circuit 105, whereby the recognition rate enhances and an accurate operation becomes possible.

For example, if the filter coefficient of the adaptive filter 103 is diverged under conditions such that a noise generated by a person touching the microphone 102 is mixed or noise component including electrical noise on the circuit other than the sound signal is mixed, detection of the divergence of the filter coefficient is performed, and initialization of the filter coefficient is carried out, whereby divergence of the filter coefficient can be avoided.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

INDUSTRIAL APPLICABILITY

The present invention can be applied, other than to robots, voice recording devices such as hands-free communication of a portable telephone, and an IC recorder. The present invention is also applicable to an active noise cancelling device by generating from a speaker and the like an acoustic signal of opposite phase from the noise cancelling signal of the present invention.

Figure 1:
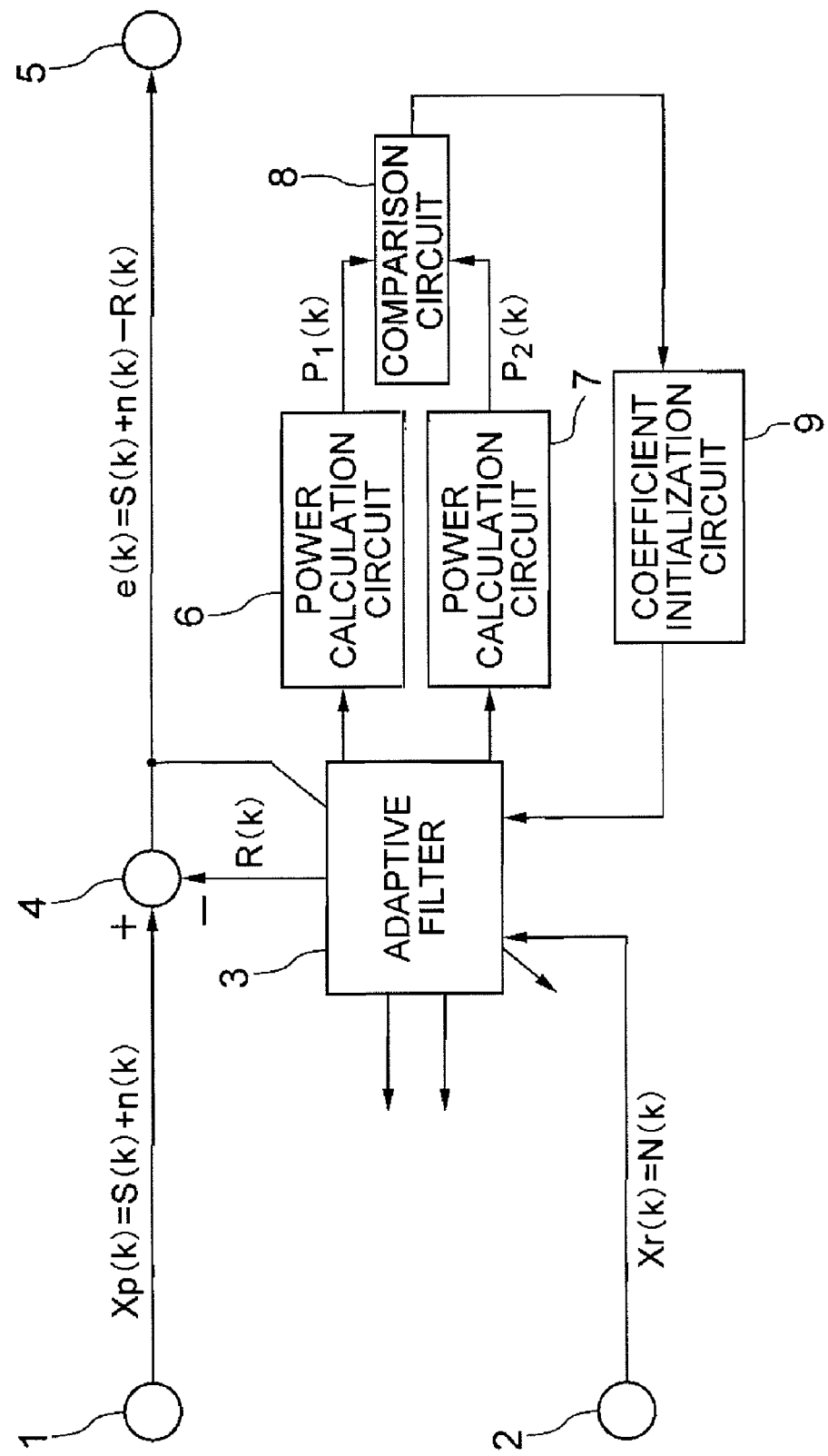
FIG. 1 is a view showing a configuration of a noise cancelling device according to a first exemplary embodiment of the invention.
Figure 2A:
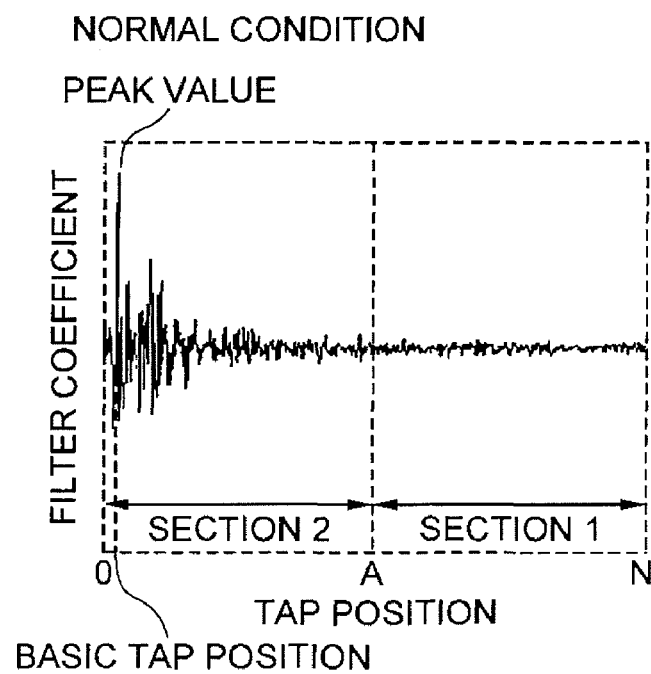
FIG. 2 is a view showing one example of a filter coefficient of an adaptive filter.
Figure 2B:
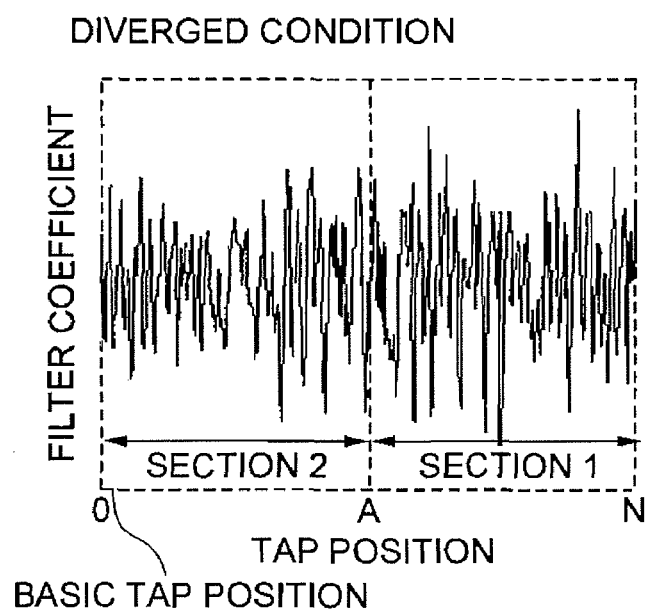
Figure 3:
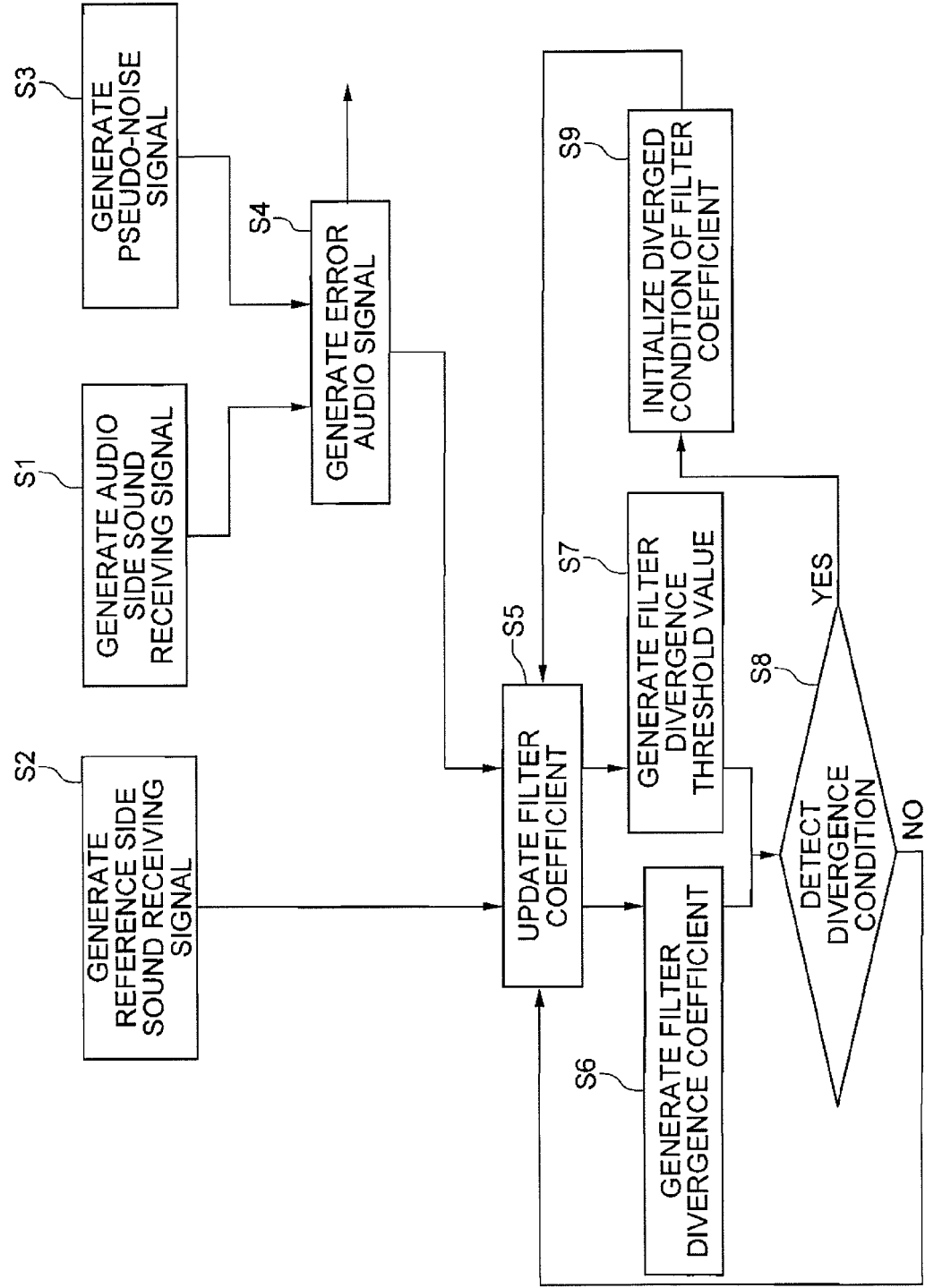
FIG. 3 is a flowchart describing an operation of the exemplary embodiment of the invention.
Figure 4:
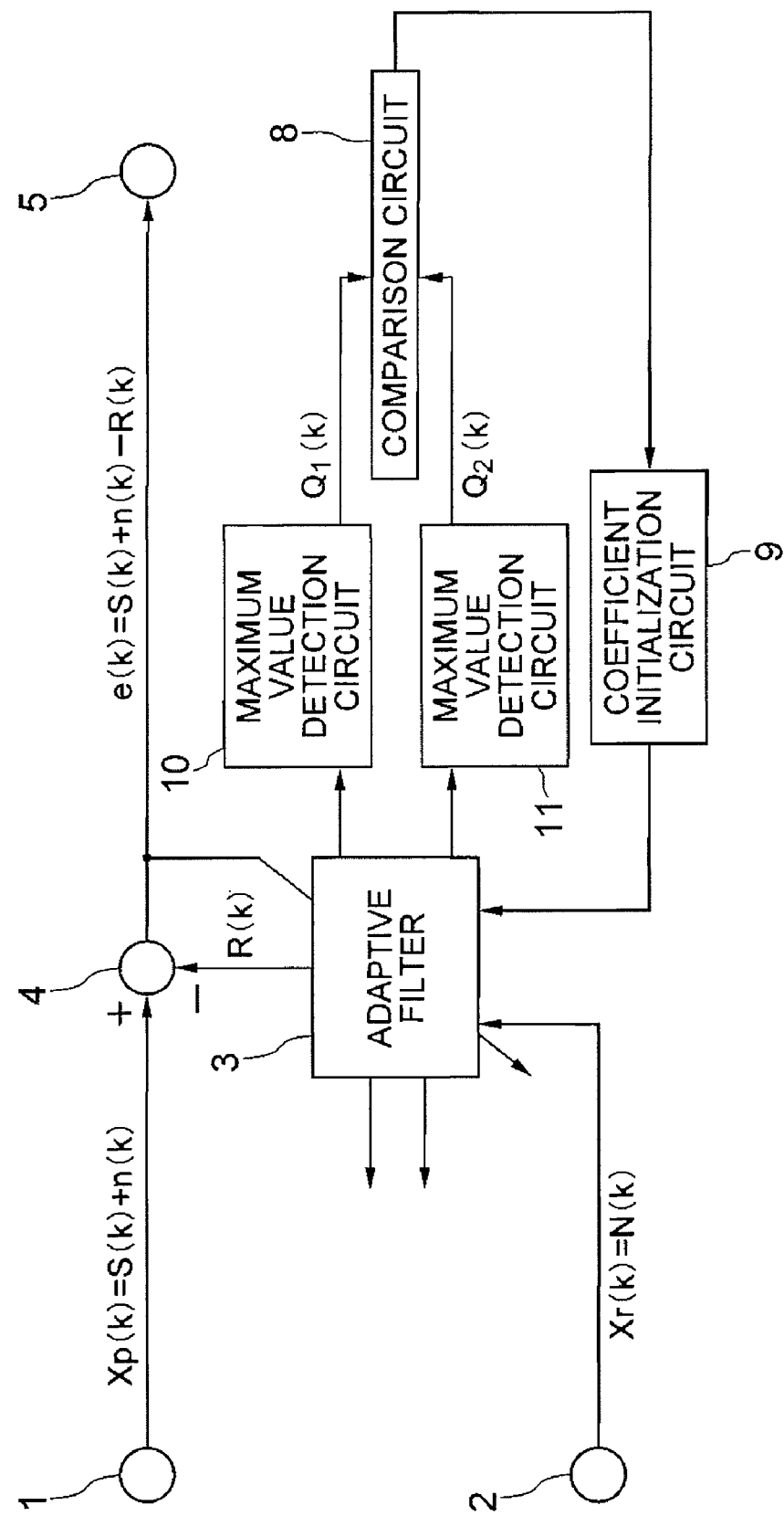
FIG. 4 is a view showing a configuration of a noise cancelling device according to a second exemplary embodiment of the invention.
Figure 5A:
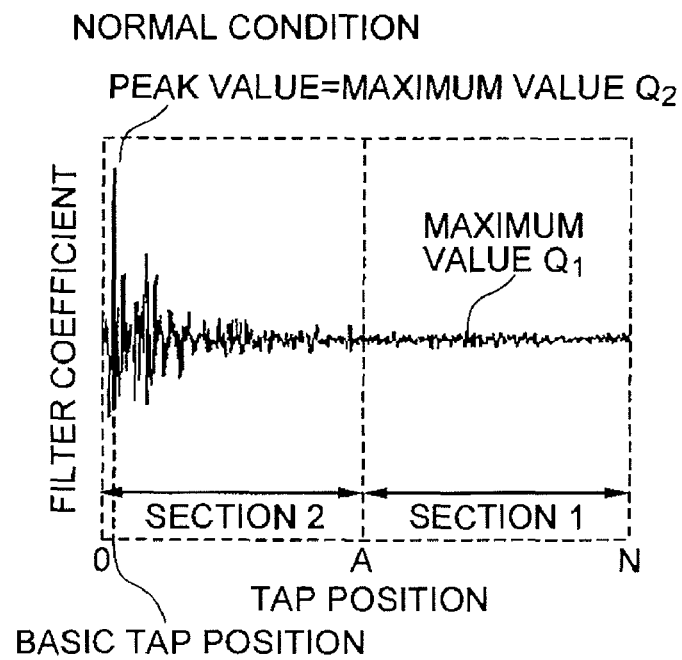
FIG. 5 is a view showing one example of a filter coefficient of an adaptive filter.
Figure 5B:
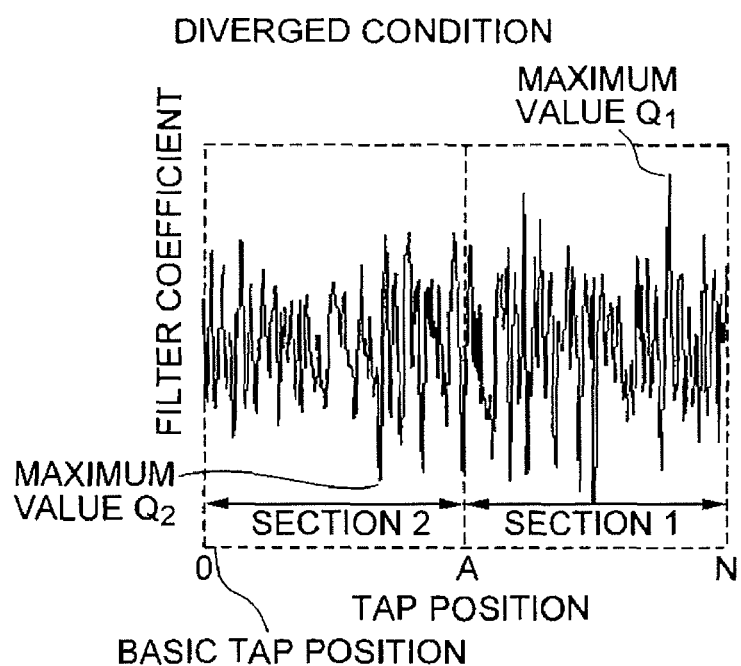
Figure 6:
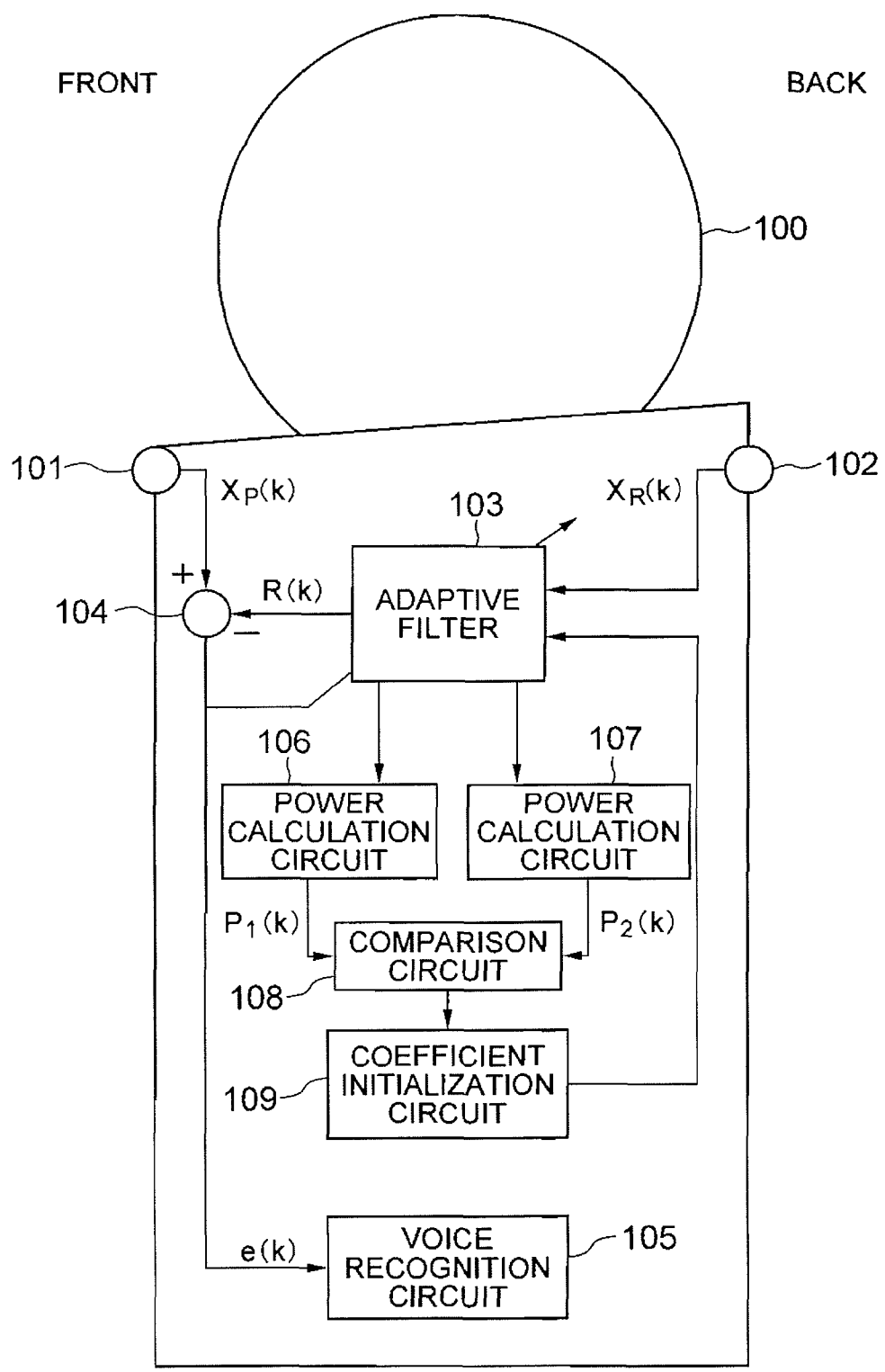
FIG. 6 is a view showing a configuration of a robot according to example 1 of the present invention.
Figure 7:
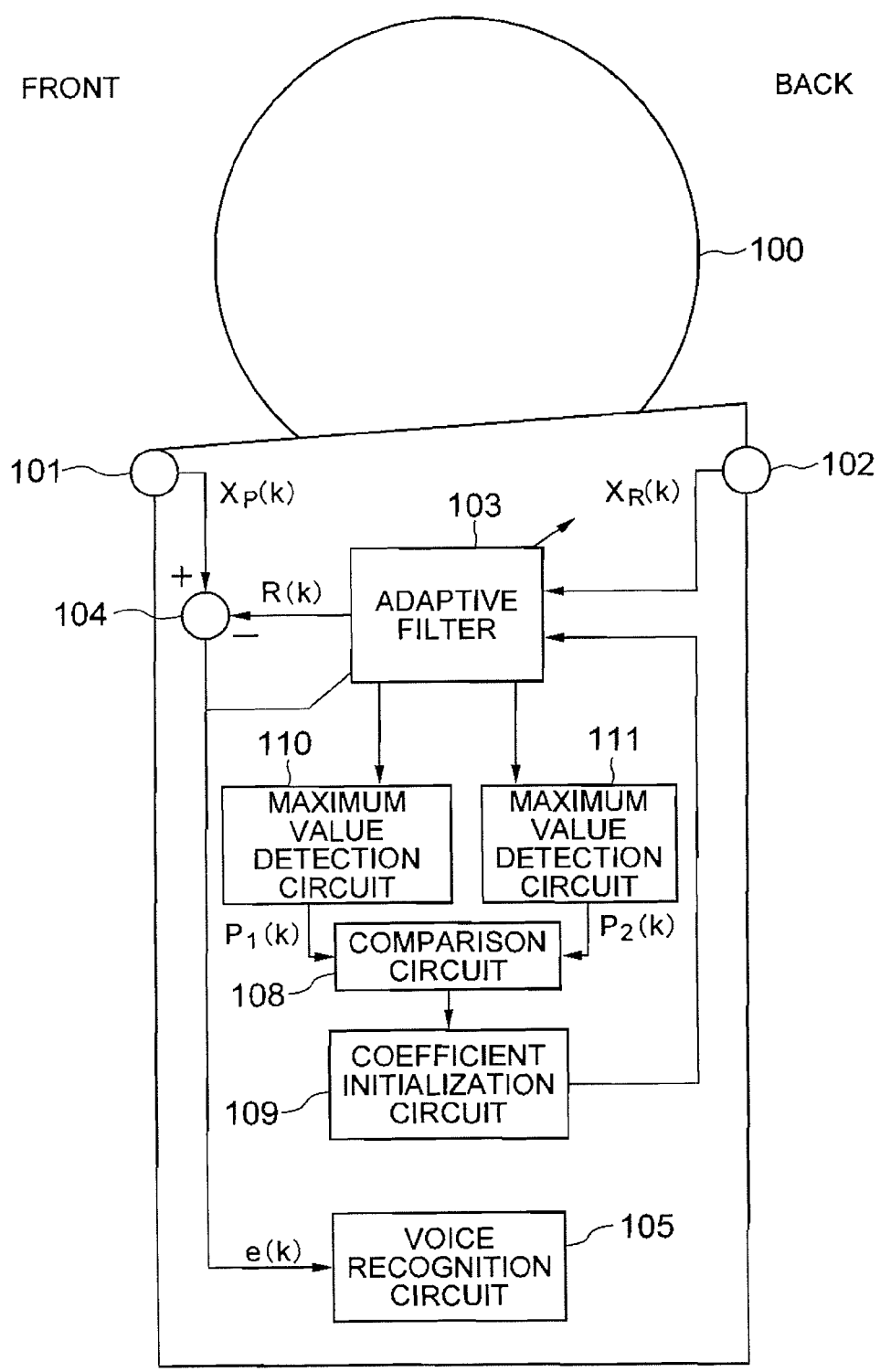
FIG. 7 is a view showing a configuration of a robot according to example 2 of the present invention.

DESCRIPTION OF SYMBOLS 1 audio input unit
2 reference input unit
3 adaptive filter
4 subtractor
5 output terminal
6, 7 power calculation circuit
8 comparison circuit
9 coefficient initialization circuit
10, 11 maximum value detection circuit

The invention claimed is:

1. A noise cancelling device for generating a noise suppressed signal by subtracting a pseudo-noise signal generated by an adaptive filter based on a reference side sound receiving signal generated by a reference input unit from an audio side sound receiving signal generated by an audio input unit; the noise cancelling device comprising:
a coefficient classifying unit which obtains a basic tap position of the adaptive filter corresponding to a distance between the reference input unit and the audio input unit, and classifies filter coefficients of the adaptive filter into a plurality of groups using the obtained basic tap position;
a divergence detection unit for analyzing a relationship among the plurality of groups of the filter coefficients and detecting a divergence condition of the adaptive filter; and
a coefficient initialization unit for initializing the filter coefficient if the coefficient of the adaptive filter is diverged.

2. The noise cancelling device according to claim 1, wherein the basic tap position is obtained using the distance between the reference input unit and the audio input unit, a sound speed, and a sampling frequency.

3. The noise cancelling device according to claim 1, wherein the filter coefficients are classified into a plurality of groups of a group including the filter coefficient at the basic tap position, and a group including other filter coefficients.

4. The noise cancelling device according to claim 3, wherein tap lengths of the groups are set the same.

5. The noise cancelling device according to claim 3, wherein
the relationship among the plurality of groups of the filter coefficients is analyzed based on a filter divergence coefficient obtained from the group including the filter coefficient at the basic tap position, and a filter divergence threshold value obtained from the group including other filter coefficients, and detecting the adaptive filter as being in a diverged condition if the filter divergence coefficient is larger than constant multiples of the filter divergence threshold value.

6. The noise cancelling device according to claim 5, wherein the filter divergence coefficient is obtained based on a power value of the filter coefficient, and the filter divergence threshold value is obtained based on a power value of the filter coefficient.

7. The noise cancelling device according to claim 5, wherein the filter divergence coefficient is obtained based on a maximum value of the filter coefficient, and the filter divergence threshold value is obtained based on a maximum value of the filter coefficient.

8. The noise cancelling device according to claim 1, wherein the filter coefficients are classified into a plurality of groups of a group including the filter coefficient at the vicinity of the basic tap position, and a group including other filter coefficients.

9. The noise cancelling device according to claim 1, wherein
the plurality of groups is set to a group of a first half and a group of a second half of a total tap length of the adaptive filter; and
the filter coefficient at the basic tap position is included in either group of the first half or the second half.

10. The noise cancelling device according to claim 1, wherein the initialization is executed by setting the filter coefficient to zero.

11. The noise cancelling device according to claim 1, wherein the initialization is executed by setting the filter coefficient to a filter coefficient before divergence.

12. Noise cancelling means for generating a noise suppressed signal by subtracting a pseudo-noise signal generated by an adaptive filter based on a reference side sound receiving signal generated by a reference input unit from an audio side sound receiving signal generated by an audio input unit; the noise cancelling means comprising:
coefficient classifying means which obtains a basic tap position of the adaptive filter corresponding to a distance between the reference input unit and the audio input unit, and classifies filter coefficients of the adaptive filter into a plurality of groups using the obtained basic tap position;
divergence detection means for analyzing a relationship among the plurality of groups of the filter coefficients and detecting a divergence condition of the adaptive filter; and
coefficient initialization means for initializing the filter coefficient if the coefficient of the adaptive filter is diverged.

13. A noise cancelling method for generating a noise suppressed signal by subtracting a pseudo-noise signal generated by an adaptive filter based on a reference side sound receiving signal generated by a reference input unit from an audio side sound receiving signal generated by an audio input unit; the noise cancelling method comprising:
obtaining a basic tap position of the adaptive filter corresponding to a distance between the reference input unit and the audio input unit;
classifying filter coefficients of the adaptive filter into a plurality of groups using the obtained basic tap position;
analyzing a relationship among the plurality of groups of the filter coefficients and detecting a divergence condition of the adaptive filter; and
initializing the filter coefficient if the coefficient of the adaptive filter is diverged.

14. The noise cancelling method according to claim 13, wherein the basic tap position is obtained using the distance between the reference input unit and the audio input unit, a sound speed, and a sampling frequency.

15. The noise cancelling method according to claim 13, wherein the filter coefficients are classified into a plurality of groups of a group including the filter coefficient at the basic tap position, and a group including other filter coefficients.

16. The noise cancelling method according to claim 15, wherein tap lengths of the groups are set the same.

17. The noise cancelling method according to claim 15, wherein
the plurality of groups is set to a group of a first half and a group of a second half of a total tap length of the adaptive filter; and
the filter coefficient at the basic tap position is included in either group of the first half or the second half.

18. The noise cancelling method according to claim 15, wherein
the relationship among the plurality of groups of the filter coefficients is analyzed based on a filter divergence coefficient obtained from the group including the filter coefficient at the basic tap position, and a filter divergence threshold value obtained from the group including other filter coefficients, and detecting the adaptive filter as being in a diverged condition if the filter divergence coefficient is larger than constant multiples of the filter divergence threshold value.

19. The noise cancelling method according to claim 18, wherein the filter divergence coefficient is obtained based on a power value of the filter coefficient, and the filter divergence threshold value is obtained based on a power value of the filter coefficient.

20. The noise cancelling method according to claim 18, wherein the filter divergence coefficient is obtained based on a maximum value of the filter coefficient, and the filter divergence threshold value is obtained based on a maximum value of the filter coefficient.

21. The noise cancelling method according to claim 13, wherein the filter coefficients are classified into a plurality of groups of a group including the filter coefficient at the vicinity of the basic tap position, and a group including other filter coefficients.

22. The noise cancelling method according to claim 13, wherein the initialization is executed by setting the filter coefficient to zero.

23. The noise cancelling method according to claim 13, wherein the initialization is executed by setting the filter coefficient to a filter coefficient before divergence.

24. A non-transitory computer readable recording medium storing a noise cancelling program for causing a computer configuring a noise cancelling device, which generates a noise suppressed signal by subtracting a pseudo-noise signal generated by an adaptive filter based on a reference side sound receiving signal generated by a reference input unit from an audio side sound receiving signal generated by an audio input unit, to execute functions of:
obtaining a basic tap position of the adaptive filter corresponding to a distance between the reference input unit and the audio input unit;
classifying filter coefficients of the adaptive filter into a plurality of groups using the obtained basic tap position;
analyzing a relationship among the plurality of groups of the filter coefficients and detecting a divergence condition of the adaptive filter; and
initializing the filter coefficient if the coefficient of the adaptive filter is diverged.

25. The non-transitory computer readable recording medium storing the noise cancelling program according to claim 24, for causing the computer to execute a process of obtaining the basic tap position using the distance between the reference input unit and the audio input unit, a sound speed, and a sampling frequency.

26. The non-transitory computer readable recording medium storing the noise cancelling program according to claim 24, for causing the computer to execute a process of classifying the filter coefficients into a plurality of groups of a group including the filter coefficient at the basic tap position, and a group including other filter coefficients.

27. The non-transitory computer readable recording medium storing the noise cancelling program according to claim 26, for causing the computer to execute a process of setting tap lengths of the groups the same.

28. The non-transitory computer readable recording medium storing the noise cancelling program according to claim 26, for causing the computer to execute a process of:
analyzing the relationship among the plurality of groups of the filter coefficients based on a filter divergence coefficient obtained from the group including the filter coefficient at the basic tap position, and a filter divergence threshold value obtained from the group including other filter coefficients, and detecting the adaptive filter as being in a diverged condition if the filter divergence coefficient is larger than constant multiples of the filter divergence threshold value.

29. The non-transitory computer readable recording medium storing the noise cancelling program according to claim 28, for causing the computer to execute a process of obtaining the filter divergence coefficient based on a power value of the filter coefficient, and obtaining the filter divergence threshold value based on a power value of the filter coefficient.

30. The non-transitory computer readable recording medium storing the noise cancelling program according to claim 28, for causing the computer to execute a process of obtaining the filter divergence coefficient based on a maximum value of the filter coefficient, and obtaining the filter divergence threshold value based on a maximum value of the filter coefficient.

31. The non-transitory computer readable recording medium storing the noise cancelling program according to claim 24, for causing the computer to execute a process of classifying the filter coefficients into a plurality of groups of a group including the filter coefficient at the vicinity of the basic tap position, and a group including other filter coefficients.

32. The non-transitory computer readable recording medium storing the noise cancelling program according to claim 24, for causing the computer to execute processes of:
setting the plurality of groups to a group of a first half and a group of a second half of a total tap length of the adaptive filter; and
including the filter coefficient at the basic tap position in either group of the first half or the second half.

33. The non-transitory computer readable recording medium storing the noise cancelling program according to claim 24, for causing the computer to execute the process of initialization by setting the filter coefficient to zero.

34. The non-transitory computer readable recording medium storing the noise cancelling program according to claim 24, for causing the computer to execute the process of initialization by setting the filter coefficient to a filter coefficient before divergence.

\* \* \* \* \*